United States Patent [19]

Black et al.

[11] Patent Number: 5,614,834
[45] Date of Patent: Mar. 25, 1997

[54] SAMPLING RECEIVERS

[75] Inventors: Alistair Black, Los Gatos; Raj B. Apte, Palo Alto; David M. Bloom, Portola Valley, all of Calif.

[73] Assignee: The United States of America as represented by the Secretary of the Air Force, Washington, D.C.

[21] Appl. No.: 404,859

[22] Filed: Mar. 15, 1995

[51] Int. Cl.⁶ .............................. G01R 23/17; G01R 1/04; G06G 9/00; G01B 9/02
[52] U.S. Cl. ..................... 324/753; 364/822; 364/713; 364/807
[58] Field of Search .................... 324/753; 364/822, 364/77 K, 845, 726, 713, 485, 821, 887; 350/96.14; 356/345

[56] References Cited

U.S. PATENT DOCUMENTS

| | | | |
|---|---|---|---|
| 4,446,425 | 5/1984 | Valdmanis et al. | 324/77 K |
| 4,456,877 | 6/1984 | Brown | 324/77 K |
| 4,681,449 | 7/1987 | Bloom et al. | 356/364 |
| 4,745,361 | 5/1988 | Nees et al. | 324/158 R |
| 4,843,586 | 6/1989 | Nazarathy et al. | 364/822 |
| 4,875,006 | 10/1989 | Henley et al. | 324/158 R |

OTHER PUBLICATIONS

Weingarten Kurt J. et al, "Picosecond Optical Sampling of GaAs Integrated Circuits", IEEE Journal of Quantum Electronics, vol. 24, No. 2, Feb. 1988, pp. 198–218.

Heinrich, H.K. et al, "Noninvasive sheet charge density probe for integrated silicon devices", Appl. Phys. Lett. 48 (16), 21 Apr. 1986, pp. 1066–1068.

Primary Examiner—Kenneth A. Wieder
Assistant Examiner—Barry C. Bowser
Attorney, Agent, or Firm—William G. Auton

[57] ABSTRACT

A Golay sampling receiver is used for optical sampling of voltage and charge at the internal nodes of analog and digital integrated circuits. The sampling receiver uses very high sampling rates together with narrow banding to recover very small signals in the presence of noise. The sampling system is based on harmonic mixing, which is the interaction of a laser sampling train with the electro-optic modulator formed in the GaBs substrate of the device under test. The application of the Golay sampling receiver to an electro-optic sampling system allows the flexibility of running the signal under test at a subharmonic of the laser pulse repetition rate, as well as any harmonic of these subharmonics. The subharmonics are determined by the length code used in the Golay receiver. For a given signal to be sampled, the fundamental frequency is chosen to be a function of the fixed sample rate divided by the code length, and the baseband offset.

3 Claims, 4 Drawing Sheets

SAMPLING RECEIVERS

STATEMENT OF GOVERNMENT INTEREST

The invention described herein may be manufactured and used by or for the Government for governmental purposes without the payment of any royalty thereon.

BACKGROUND OF THE INVENTION

Optical sampling of voltage and charge at the internal nodes of analog and digital integrated circuits has been accomplished in both Gallium Arsenide and Silicon. Though the physical mechanisms of the sampling are different for the two material systems, both techniques require low noise, narrowband receiver electronics. Another limitation of sampling technology as it is now practiced is that the signal repetition rate must be at a harmonic of the sampling rate. In the case of optical sampling techniques, the signal repetition rate is governed by the laser cavity itself. In order to take advantage of the higher bandwidths possible with faster lasers. This invention provides a technique that allows the sampling rate to exceed the signal repetition rate, or fundamental. In accordance with this invention, we provide a sampling receiver design which is generally useful for any noisy sampling operation. With this sampling receiver, which we call the Golay Sampling Receiver, it is possible to use very high sampling rates together with narrow banding to recover very small signals in the presence of noise.

Background for this invention is discussed in several papers on electro-optic sampling. For example, see K. J. Weingarten, et al, "Picosecond Optical Scanning of GaAs Integrated Circuits", IEEE *Journal of Quantum Electronics*, JQE-24, No. 2, February 1988; B. H. Kolner et al, "Electro-optic Sampling With Picosecond Resolution", *Electronics Letters*, Vol. 19, pp. 574–575; H. K. Heinrich, et al, "Non-invasive Sheet Charge Density Probe Of Integrated Silicon Devices" *Applied Physics Letters*, Vol. 48, pp. 1066–1068, 1986; and H. K. Heinrich et al, Measurement of Real *Electronics Letters*, Vol. 19, pp. 574–575; H. K. Heinrich, et al, "Noninvasive Sheet Charge Density Probe Of Integrated Silicon Devices" *Applied Physics Letters*, Vol. 48, pp. 1066–1068, 1986; and H. K. Heinrich et al, "Measurement of Real time digital Signals In A Silicon Bipolar Junction Transistor Using A Noninvasive Optical Probe", *Electronic Letters*, Vol. 22, pp. 650–652, 1986.

The following prior art patents relate to electro-optic sampling of electronic circuits:

U.S. Pat. No. 4,875,006, Henley et al;
U.S. Pat. No. 4,745,361, Nees et al;
U.S. Pat. No. 4,681,449, Bloom et al; and
U.S. Pat. No. 4,446,425, Valdmanis et al.

Henley et al describes a high speed test system for semiconductor integrated circuits. The system comprises an adapter board for receiving a circuit for test, a plurality of driver circuits positioned around the adapter board for applying test patterns and voltages to the integrated circuit, and an electro-optic sensor. The driver circuits are connected to contacts of the circuit undergoing test, which are in turn connected to the electro-optic sensor. A laser provides light sampling pulses through the electro-optic sensor, and directs reflections of the sampling pulses from the sensor to an electro-optic voltage measuring means. Finally, a central means is provided for controlling the system.

Ness et al relates to an electro-optic network analysis system, which uses electro-optic sampling. The device under test is integrated on a substrate of electro-optic semiconductor material, and is connected to transmission lines on the substrate. Electro-optically generated sampling signals propagate along the transmission lines toward and away from the device under test. The signals are electrically sampled by a laser pulse sampling beam, which is responsive to the change in refractive index due to the signal at locations equidistant from the generation position. The waveform resulting from electro-optic sampling near the device under test corresponds to the sum of the signal incident upon the device and the signal reflected therefrom, while the waveform resulting from electro-optic sampling at the location away from the device corresponds to the incident waveform. The waveforms are mathematically processed and Fourier transformed to derive the scattering parameters.

Bloom et al describes a non-contact test system for high speed testing of electronic circuits by electro-optic sampling. A laser optically generates signals in a compound semiconductor. The signal is transmitted to a microstrip on the semiconductor surface. A second polarized laser signal is passed through the crystal, and its polarization is modulated by the electric field in the microstrip. The polarization presents a measure of the field strength and the signal. An equivalent time representation of the sampled signal can be obtained by varying the relative delay between two beams.

Valdmanis et al relates to a system for the measurement of electrical signals by electro-optic sampling of the signal being analyzed in a traveling wave Pockels cell. Laser sampling pulses of subpicosecond duration are transmitted through the cell as polarized light, and translated into a difference output corresponding to the difference in amplitude between the transmitted and rejected components of the polarized light. Signals, which are synchronous with the optical sampling pulses, are generated to propagate along the cell in a direction which is transverse to and in variably delayed relationship with the transmission of the optical sampling pulses. A separate beam of the optical pulses is desirably chopped and used to activate a photoconductive device which produces the signals. The difference output is processed and displayed on a time basis which is synchronous with the variable delay of the pulses. The signal is displayed on an expanded time scale for measurement and other analysis.

SUMMARY OF THE INVENTION

This invention uses a Golay sampling receiver for optical sampling of voltage and charge at the internal nodes of analog and digital integrated circuits. The Golay sampling receiver uses very high sampling rates together with narrow banding to recover very small signals in the presence of noise. The sampling system is based on harmonic mixing, which is the interaction of a laser sampling train with the electro-optic modulator formed in the GaAs substrate of the device under test. The application of the Golay sampling receiver to an electro-optic sampling system allows the flexibility of running the signal under test at a subharmonic of the laser pulse repetition rate, as well as any harmonic of these subharmonics. The subharmonics are determined by the length code used in the Golay receiver. For a given signal to be sampled, the fundamental frequency is chosen to be a function of the fixed sample rate divided by the code length, and the baseband offset.

BRIEF DESCRIPTION OF THE DRAWINGS

For a fuller understanding of the nature of this invention, reference should now be made to the following specification and to the accompanying drawings, in which.

DETAILED DESCRIPTION OF THE PREFERRED EMBODIMENTS

This invention is applicable to noninvasive optical probing in GaAs, Si and in various noisy electronic samplers generally. However, for clarity, the specification describes sampling only in GaAs. The invention applies to sampling systems based on harmonic mixing generally. Harmonic mixing is the interaction of a laser sampling train with the electrooptic modulator formed in the GaAs substrate of the device under test (DUT). This may be modelled as a mixing process between a set of comb lines representing the laser sampling train and the signal in the DUT.

FIGS. 1a to 1d detail the sampling process in existing prior art systems, where the laser operates near a sub-harmonic of the signal fundamental. It shows the Nth harmonic of the laser pulse train mixing the fundamental of the RF signal down to a baseband offset $\delta f$. Additional harmonics of the RF signal will be mixed down to harmonics of $\delta f$.

Figure 1A:
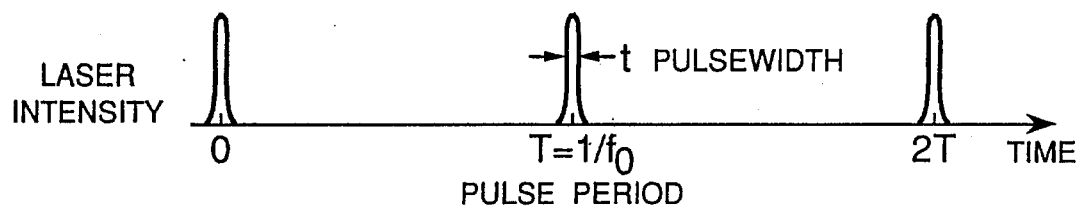
FIGS. 1a to 1d detail this mixing process in existing prior art systems.
Figure 1B:
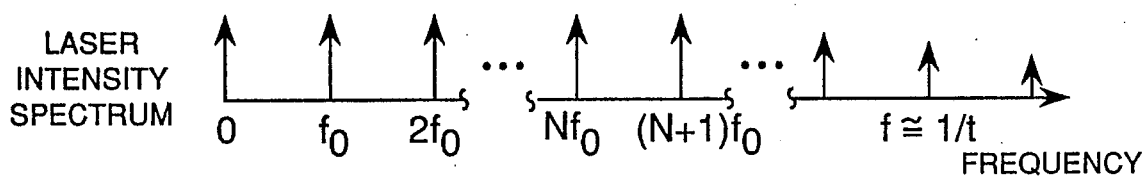
Figure 1C:
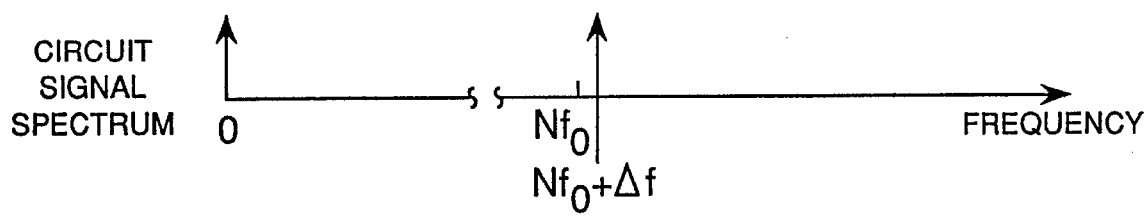
Figure 1D:
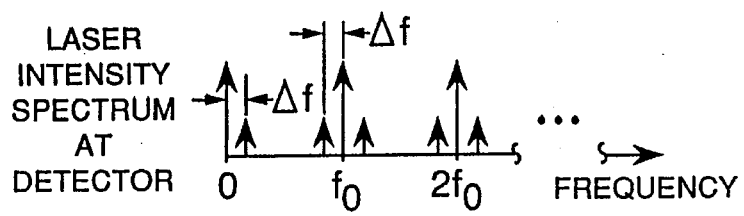
Figure 2A:
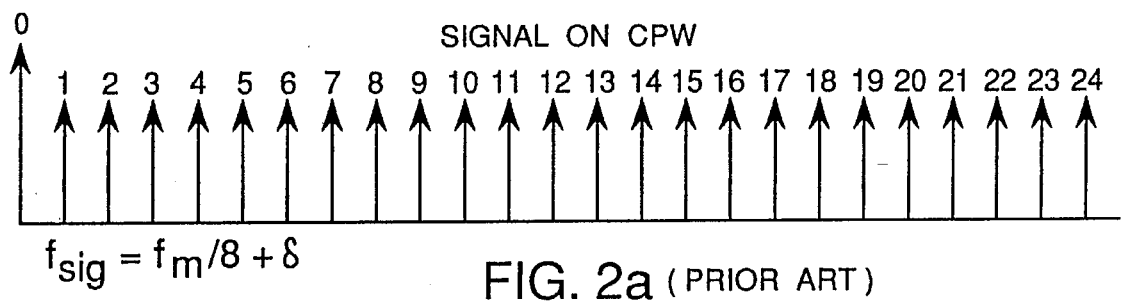
FIGS. 2a–2c are prior art representations of a process when the laser operates near a harmonic of the RF signal rather than at a sub-harmonic.
Figure 2B:
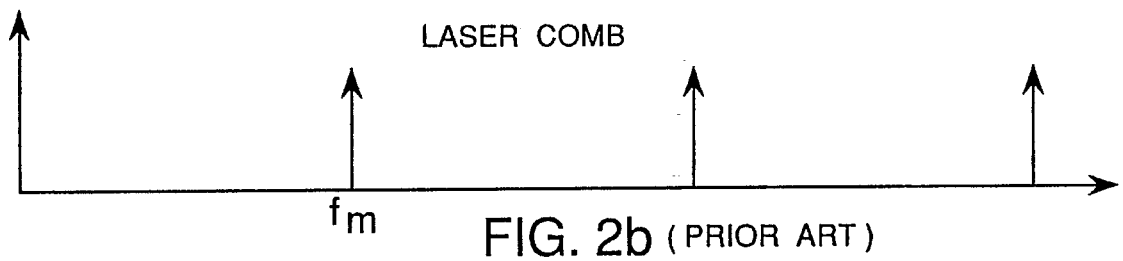
Figure 2C:
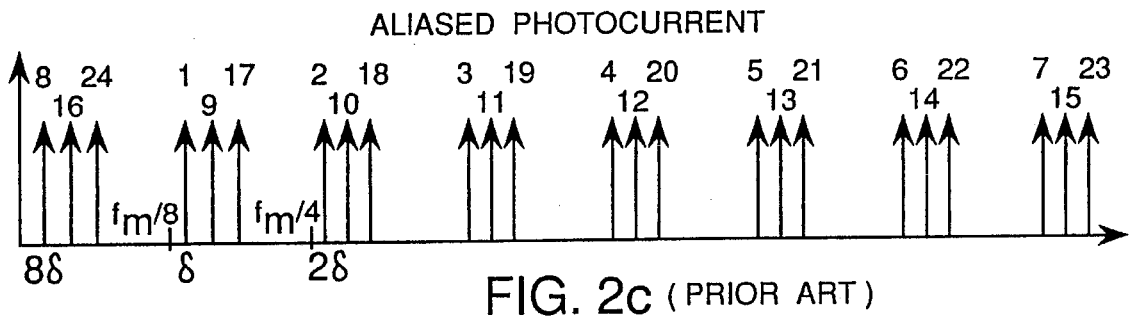

When the laser operates near a harmonic of the RF signal rather than at a sub-harmonic, the situation resembles the prior art FIGS. 2a to 2c. In this case the laser is assumed to operate at just under the eighth harmonic of the RF signal. The FIG. 2c details the aliasing of the RF as it is detected by the photodiode. Analytically, the pulse train coming from the laser is:

$$\frac{\omega_m}{2\pi} \sum_n e^{in\omega_m t}$$

The RF signal to be read from the GaAs:

$$\sum_n c_n e^{in\omega_{RF} t}$$

where $c_n$ are the fourier coefficients of the signal in the DUT. Let $\omega_{RF}/P = \omega_m/Q + \delta$, where P is the laser harmonic used to sample the fundamental of the RF signal, and Q is the oversampling parameter. The sampler output is then given by:

$$\frac{\omega_m}{2\pi} \sum_{n,m} c_m e^{i(n\omega_L + m\omega_G)t}$$

Figure 3:
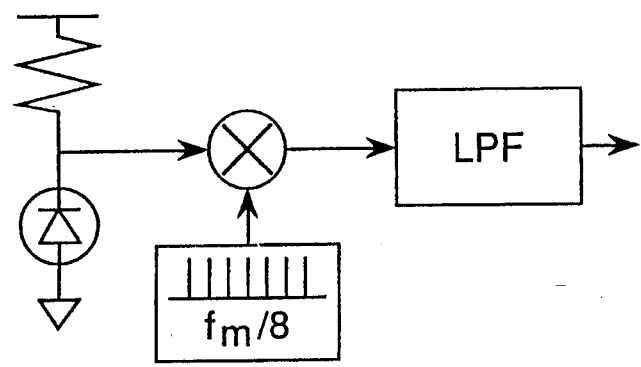
FIG. 3 shows a simple anti-aliasing sampling receiver.

FIG. 3 shows a simple way of reconstructing the signal waveform by mixing, for example, seven of the signal clusters down to the baseband. By discarding seven of eight received pulses, this receiver requires eight times the integration time to achieve the same signal to noise ratio. The alternative, to develop a waveform which does not waste the input signal energy and which has harmonics near each of the signal clusters resembles a problem in infra-red spectroscopy solved by Golay in the 1950's and a problem in optical time domain reflectometry solved recently. Golay's work was concerned with developing spectrometers for infra-red astronomy that make efficient use of the available light. See M. J. E. Golay, "Static Multislit Spectrometry and its Application to the Panoramic Display of Infrared Spectra", *Journal of the Optical Society of America*, JOSA-41, pp. 468–472, 1951, and M. Nazarathy, et al, "Spread Spectrum Frequency Response of Coded Phase Reversal Traveling Wave Modulators", *Journal of Lightwave Technology*, Vol. LT-5, No. 10, October 1987.

Figure 4:
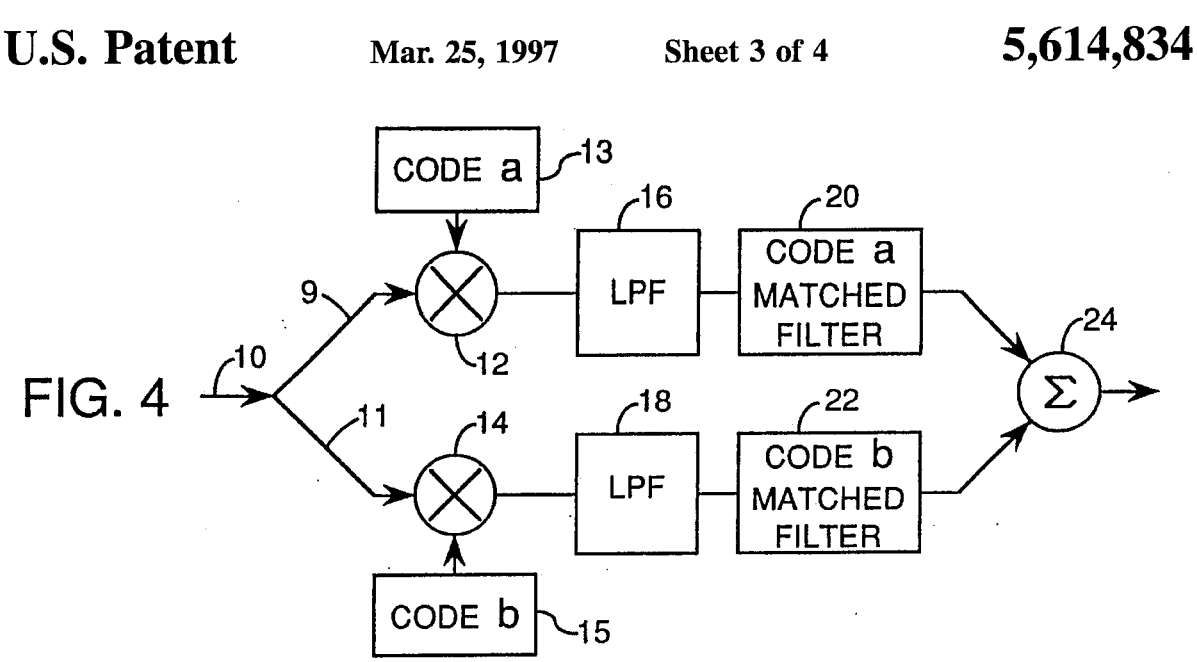
FIG. 4 shows one implementation of a sampling receiver in accordance with this invention.

A block diagram of a receiver in accordance with this invention, based on Golay's 1961 results, is given in FIG. 4. See M. J. E. Golay, "Complementary Series", *IRE Transactions on Information Theory*, IT-7, pp. 82–87. April 1961.

FIG. 4 shows a receiver comprised of a signal input at 10 which branches off an upper branch 9 and a lower branch 11, to two mixers 12 and 14 in which the signals are coded with a code 'a' supplied from a coder 13, and a code 'b' supplied from a coder 15. The outputs from mixers 12 and 14 are passed, respectively, through low pass filters 16 and 18. Thereafter, the code 'a' output of low pass filter 16 and the code "b" output of low pass filter 20 are applied, respectively, to a code 'a' matched filter 20, and a code 'b' matched filter 22. The outputs of the code "a" and code 'b' matched filters are then summed in a summer 24.

Codes 'a' and 'b' are finite length biphase codes such that the sum of the autocorrelation of code 'a' and the autocorrelation of code 'b' is a zero sidelobe impulse. Since the impulse response of the upper branch 9 is the autocorrelation of code 'a' and the impulse response of the lower branch is code 'b', the overall system function is the sum of the autocorrelations, which by construction is an impulse. In the upper branch the input to the LPF 16 is given by:

$$\frac{\omega_m}{2\pi} \sum_{n,m,j} c_m a_j e^{i\left\{\left[n + \frac{Pm}{1} + \frac{1}{N}\right]\omega_m + Pm\delta\right\}t}$$

where $a_j$ are the discrete fourier components of code 'a'. For a code of length N, where N=Q, which is the mechanism by which the code learns how many aliased harmonics it must unscramble, the output of the LFP is:

$$\frac{\omega_m}{2\pi} \sum_n c_n a_{-Pn} (\text{mod } N) \| e^{iPn\delta t}$$

This narrowband signal can easily be sampled and matched-filtered to unscramble the phases and amplitudes of the original signal. The output of the matched filter is:

$$\frac{\omega_m}{2\pi} \sum_n c_n a_{-Pn} (\text{mod } N)^2 e^{iPn\delta t}$$

The coloration of the harmonics in the upper channel added to the coloration of the lower channel is white, so that the function of the system is to mix the RF signal down from $\omega_{RF}$ to $N\delta$ without losing signal energy and without aliasing.

The effect of using a Golay code of length N is to divide the laser repetition rate $\omega_m$ by N. Although to our knowledge no sufficient condition exists for determining whether a code exists for a given N, a necessary condition is that N be expressible as the sum of no more than two perfect squares. In particular, codes exist for 11 Ns that are powers of two as well as for N=10,20,26,40 et al.

The prior art methods of signal recovery for electrooptic sampling systems require that the signal under test be tuned very closely to a harmonic of the sampling pulse train. This allows each of the signal harmonics to mix with a nearby sampler harmonic, resulting in a very narrowband signal at the IF port of the harmonic sampler. This scheme, however, limits the choice of frequencies at which the signal under test may run to harmonics of the fixed laser pulse repetition rate. The laser pulse repetition rate is often fixed by the laser cavity and is not easily changed.

In accordance with this invention, the application of the Golay Receiver to an electrooptic sampling system allows the flexibility of running the signal under test at a subharmonic of the laser pulse repetition rate as well as any harmonic of these subharmonics. These subharmonics are determined by the length code used in the Golay Receiver. Thus, if a given signal is to be sampled with a fixed sample rate $\omega_m$, then it's fundamental frequency must be chosen such that $\omega_{RF}/P=\omega_m/N+\delta$, where N is the code length and P is an integer. This greatly increases the flexibility of electrooptic sampling by increasing the number of allowed frequencies in which a DUT may be run, without sacrificing any noise performance as compared with the standard narrowband system. Further, the ability to sample signals at subharmonics of the laser pulse repetition rate will allow for the use of smaller lasers with high pulse rates.

The subharmonic sampling capability of the electrooptic samples with a Golay receiver will allow optical recovery of fast transients with low repetition rates for the first time. High speed digital circuits with internal nodes running at subharmonics of the clock frequency were previously untestable if the subharmonic was below the laser pulse repetition rate. Using the Golay receiver picosecond timing measurements between a clock edge and another edge within a digital circuit which occurs at a relatively low repetition rate can be made.

It is also important to point out that although we have described the Golay Receiver as a system for increasing the flexibility of electrooptic sampling, the technique is completely general and may be applied to an electronic sampling system which requires a narrowband IF for noise reasons. If, for example, a sampling bridge is used to acquire high speed signals in the presence of broadband noise this technique of narrowband detection removes the constraint of placing the repetition rate of the signal to be tested near a harmonic of the sampler LO, just as in the case of electrooptic sampling.

There are many possible variations and there are several block diagrams which can be implemented to achieve the Golay Receiver, as well as several systems which might use a Golay Receiver to implement narrowband detection of a sampled signal.

The most general form of the Golay receiver is shown in FIG. 4, where the received signal at terminal 10, is directed in 2 channels A and B to multiplexers 12 and 14, where the signals are encoded at high frequency with the two codes 'a' and 'b'. The encoded signals in the two channels are then put through the low-pass filters 16 and 18 to remove the high frequency noise components. This leaves in each channel the desired signal convolved with a low frequency replication of the code. Each channel is then put through a matched filter 20 or 22 specific to its code and finally the two channels are summed in a summer 24. This results in an undistorted low frequency replication of the signal at the input of the sampling system.

Figure 5:
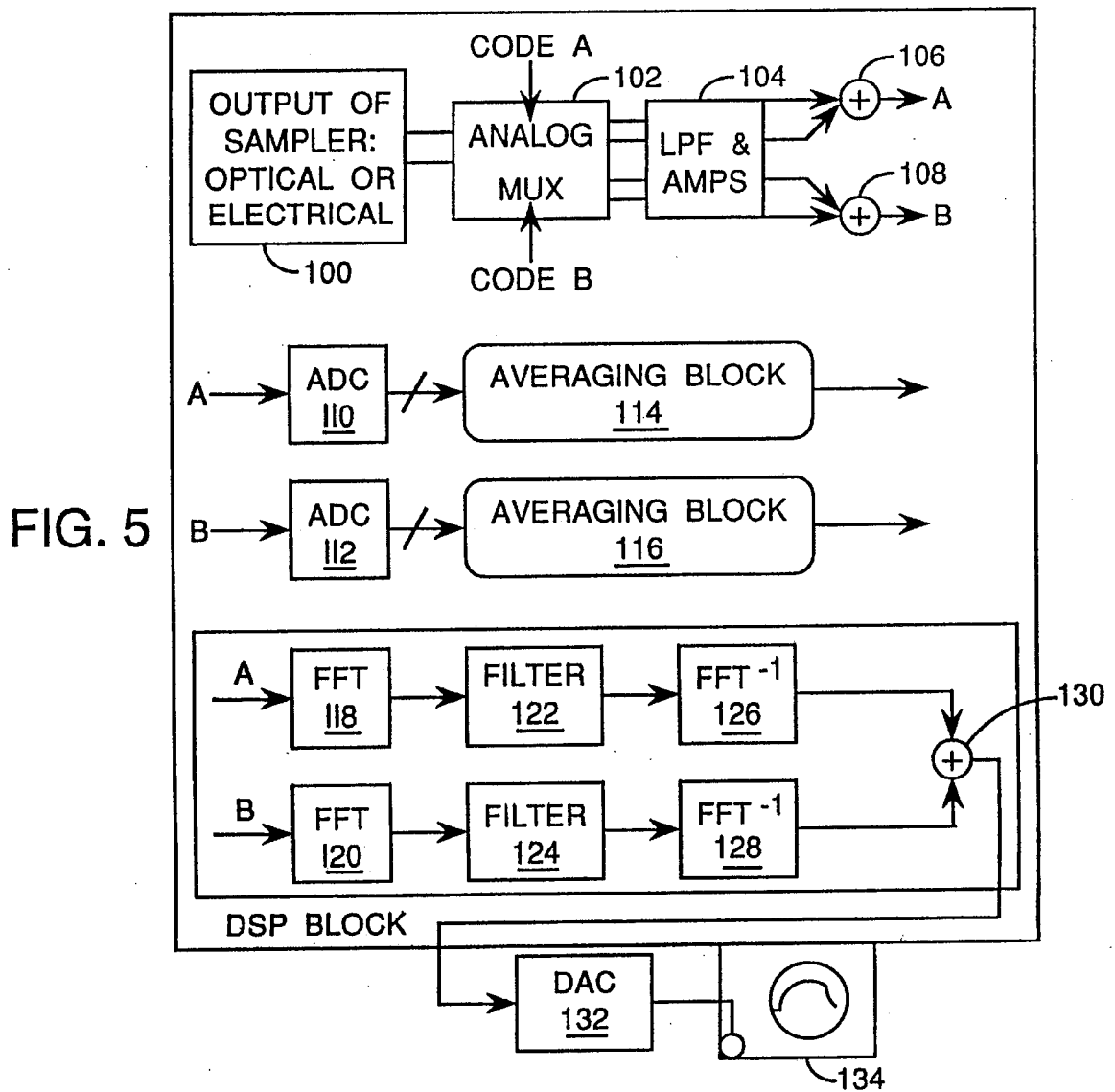
FIG. 5 shows another implementation in accordance with this invention utilizing an optical coding scheme.

A more specific implementation of the sampling receiver is shown in FIG. 5. In the system shown in this block diagram, the output pulses from a sampler head 100 in an electrical sampling system, or from a receiver photodiode in and optical sampling system, are applied in two channels to an analog multiplexer 102 where the individual pulses in each channel are encoded with code 'a' or 'b'. The signals in the separate channels are then filtered in low pass filters and amplifiers 104. The code 'a' output from the low pass filters is applied to a summer 106, while the code 'b' output is applied to a summer 108. The resulting baseband signals in each channel are then digitized in analog to digital converters 110 and 112, respectively. The digitized output from the converters 110 and 110 are then averaged in averaging blocks 114 and 116, respectively The digitized signals from each channel A and B are then digitally processed, respectively, in FFT's 118 and 120, filters 122 and 124, and $FFT^{-1}$'s 126 and 128. The outputs of the $FFT^{-1}$'s are then combined in a summer 130. The signal from the combined channels are the converted from digital to analog in the digital to analog converter 132 to produce the low frequency replication of the sampled signal. The analog output is then shown in a conventional manner on a display 134.

Figure 6A:
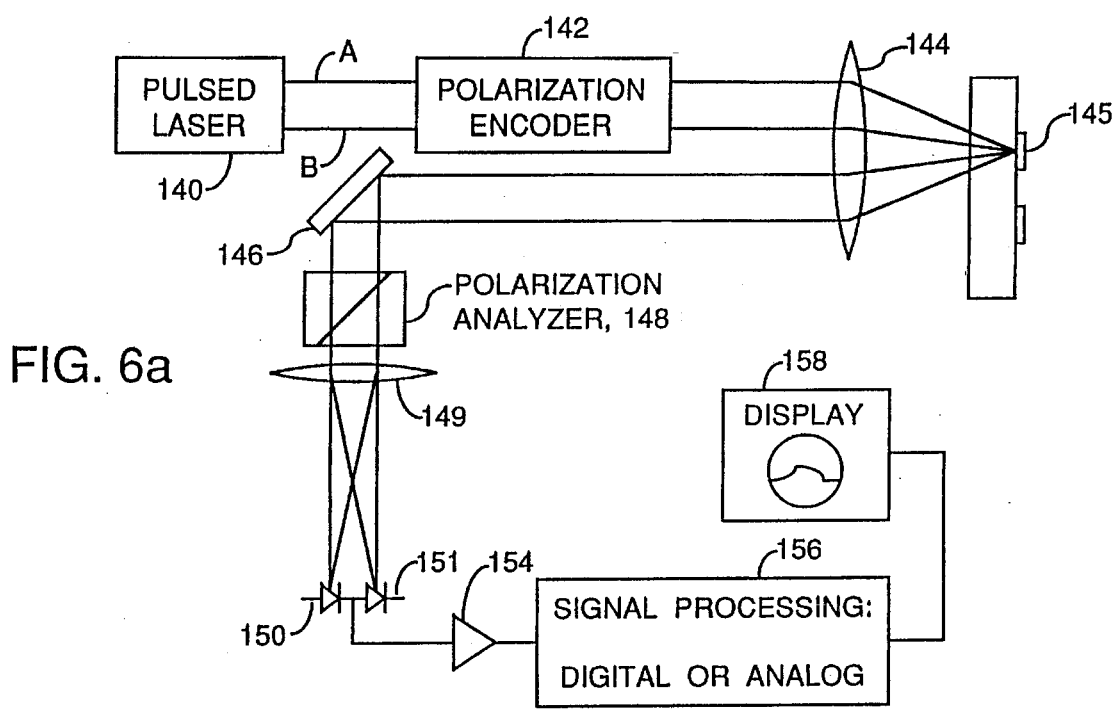
FIGS. 6a, 6b and 6c is another preferred implementation of a sampling receiver, using a coimplementation using an optical coding.
Figure 6B:
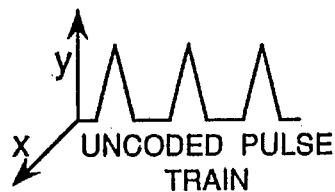
Figure 6C:
Figure 7A:
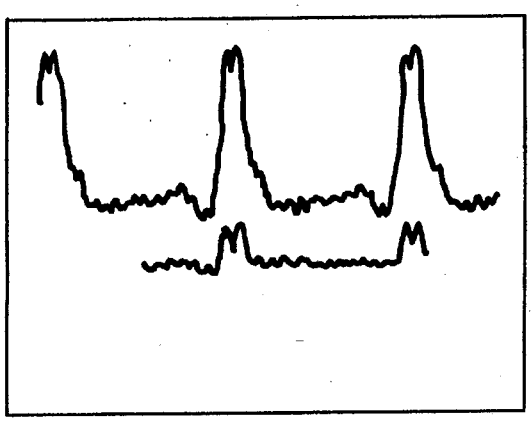
FIGS. 7a and 7b are waveforms showing the results of the invention using a two bit code.
Figure 7B:
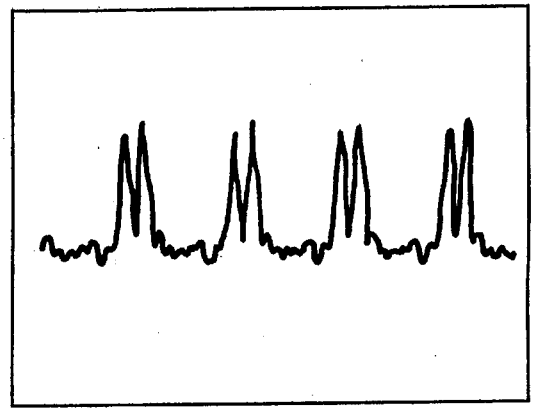

Another implementation which applies only to optical sampling systems, utilizes an optical coding scheme as shown in FIG. 6. In this system, uncoded output (as depicted in FIG. 6b) from a pulsed laser 140 is applied through channels A and B, to a polarization encoder 142 where the signal in channel A is encoded by a pulse code trains 'a' and 'b', as depicted in FIG. 6c. The optical pulses are focused by lens 144 and are reflected to a DUT 145. The laser pulses are modulated by the DUT and reflected back through lens 144 to mirror 146 and through a polarization analyzer 148. The optical output from the polarization analyzer is then focused through lens 149 onto photodiode detectors 150 and 151, the output of which is applied to amplifier 154. The digital output of amplifier 154 is then converted to analog in a digital to analog converter 156. The output of the converter is then shown on a display 158.

The high frequency coding in this FIG. 6 implementation is accomplished by a high speed electrooptic modulator capable of switching the polarization of the probe beam and imprinting the codes on the actual optical beam before the photodiode detector. This technique has the advantage that all of the electronics are relatively slow, and no high speed multiplexing is required. However, the two required codes cannot be imprinted on the probe beam at the same time, requiring a serial interleaving of the codes.

Clearly, this invention is subject to many variations and adaptations, and it is intended, therefore, that this invention be limited only by the appended claims as interpreted in the light of the prior art.

What is claimed is:

1. A method for optically sampling voltages and charges at an internal node of an integrated semiconductor device under test (DUT), said DUT having a substrate and internal nodes:

generating a laser sampling train of pulses having a fixed pulse repetition rate, said train of pulses interacting at said node with an electro-optic modulator formed in said substrate, setting the modulation frequency of the signal of said DUT at a subharmonic of the laser pulse repetition rate;

applying said sampling train to said sampling receiver, in pulse repetition rate, said train of pulses interacting at said node with an electro-optic modulator formed in said substrate, setting the modulation frequency of the signal of said DUT at a subharmonic of the laser pulse repetition rate;

applying said sampling train to said sampling receiver, in first and second tracks;

applying a first code to said train in the first of said tracks;

applying a second code to said train in the second of said tracks;

low pass filtering said first and second coded signals to remove high frequency noise components;

filtering the coded in a filter specific to each code; and recombining the filtered signals.

2. The method of claim 1 wherein said subharmonics are determined by the length of said codes, the sampled signal having a fundamental frequency which is a function of the fixed sample rate divided by said code length, and a baseband offset.

3. The method of claim 1 wherein said codes are finite length biphase codes such that the sum of the autocorrelation of the codes is a zero sideband impulse.

* * * * *